(12) United States Patent
Nagamatsu et al.

(10) Patent No.: US 8,068,343 B2
(45) Date of Patent: Nov. 29, 2011

(54) SEMICONDUCTOR MODULE, PORTABLE DEVICE AND METHOD FOR MANUFACTURING SEMICONDUCTOR MODULE

(75) Inventors: Masayuki Nagamatsu, Mizuho (JP); Ryosuke Usui, Ichinomiya (JP); Yasunori Inoue, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 307 days.

(21) Appl. No.: 11/829,560

(22) Filed: Jul. 27, 2007

(65) Prior Publication Data

US 2008/0197482 A1  Aug. 21, 2008

(30) Foreign Application Priority Data

Jul. 28, 2006  (JP) ................................ 2006-205466
Jul. 4, 2007   (JP) ................................ 2007-176296

(51) Int. Cl.
*H05K 7/00* (2006.01)

(52) U.S. Cl. ........ 361/728; 361/704; 361/709; 361/718; 361/752; 361/760; 174/250; 174/252; 257/79; 257/89; 257/355; 257/690; 257/758; 257/777; 438/107; 438/618

(58) Field of Classification Search .............. 361/728, 361/704, 709, 752, 760, 718; 257/690, 758, 257/79, 89, 355, 767, 777; 174/250, 252; 438/107, 618

See application file for complete search history.

(56) References Cited

U.S. PATENT DOCUMENTS

| 4,298,903 | A | * | 11/1981 | Ellis | 361/704 |
| 4,473,108 | A | * | 9/1984 | Jansson et al. | 165/8 |
| 4,499,557 | A | * | 2/1985 | Holmberg et al. | 365/163 |
| 4,599,705 | A | * | 7/1986 | Holmberg et al. | 365/163 |
| 4,630,096 | A | * | 12/1986 | Drye et al. | 257/777 |
| 4,722,914 | A | * | 2/1988 | Drye et al. | 438/107 |
| 5,988,266 | A | * | 11/1999 | Smith et al. | 165/78 |
| 6,410,431 | B2 | * | 6/2002 | Bertin et al. | 438/667 |
| 6,432,809 | B1 | * | 8/2002 | Tonti et al. | 438/618 |
| 6,522,555 | B2 | * | 2/2003 | Hirano et al. | 361/760 |
| 6,570,247 | B1 | * | 5/2003 | Eiles et al. | 257/707 |
| 6,713,865 | B2 | * | 3/2004 | Nomura | 257/712 |
| 6,943,436 | B2 | * | 9/2005 | Radu et al. | 257/678 |
| 6,969,891 | B1 | * | 11/2005 | Leroux | 257/355 |
| 7,041,535 | B2 | * | 5/2006 | Yamashita et al. | 438/122 |
| 7,091,594 | B1 | * | 8/2006 | Kim et al. | 257/687 |
| 7,208,825 | B2 | * | 4/2007 | Pu et al. | 257/686 |
| 7,444,822 | B2 | * | 11/2008 | Takahashi et al. | 62/3.7 |
| 7,476,811 | B2 | * | 1/2009 | Kubota et al. | 174/250 |
| 2001/0028552 | A1 | * | 10/2001 | Letourneau | 361/704 |
| 2004/0188062 | A1 | * | 9/2004 | Belady et al. | 165/80.1 |

(Continued)

FOREIGN PATENT DOCUMENTS

JP  2004-172542  6/2004

*Primary Examiner* — Xiaoliang Chen
(74) *Attorney, Agent, or Firm* — Fish & Richardson P.C.

(57) ABSTRACT

A semiconductor module is provided, which is capable of suppressing the deterioration of reliability and improving heat radiation. The semiconductor module includes: a semiconductor substrate in which electrodes of a circuit element are formed on its surface; a re-wiring pattern connected to the electrodes to ensure large pitch of the electrodes; an electrode integrally formed with the re-wiring pattern; an insulating layer formed on a rear surface of the semiconductor substrate; a radiator formed on the insulating layer; and projections integrally formed with the radiator and penetrating the insulating layer to connect to the rear surface of the semiconductor substrate.

12 Claims, 13 Drawing Sheets

U.S. PATENT DOCUMENTS

| | | | |
|---|---|---|---|
| 2005/0116235 A1* | 6/2005 | Schultz et al. | 257/79 |
| 2005/0180117 A1* | 8/2005 | Tetsuka et al. | 361/718 |
| 2005/0274959 A1* | 12/2005 | Kim et al. | 257/79 |
| 2006/0001166 A1* | 1/2006 | Igarashi et al. | 257/758 |
| 2006/0145328 A1* | 7/2006 | Hsu | 257/690 |
| 2006/0237738 A1* | 10/2006 | Salam | 257/98 |
| 2007/0128772 A1* | 6/2007 | Yonemura et al. | 438/129 |
| 2007/0262441 A1* | 11/2007 | Chen | 257/706 |
| 2008/0123299 A1* | 5/2008 | Takakusaki et al. | 361/719 |
| 2009/0200065 A1* | 8/2009 | Otoshi et al. | 174/252 |

* cited by examiner

SEMICONDUCTOR MODULE, PORTABLE DEVICE AND METHOD FOR MANUFACTURING SEMICONDUCTOR MODULE

CROSS-REFERENCE TO RELATED APPLICATIONS

This application is based upon and claims the benefit of priority from both the prior Japanese Patent Application No. 2006-205466, filed Jul. 28, 2006 and the prior Japanese Patent Application No. 2007-176296 filed Jul. 4, 2007, the entire contents of which are incorporated herein by references.

BACKGROUND OF THE INVENTION

1. Field of the Invention

The present invention relates to a semiconductor module, and in particular, to a semiconductor module with a radiator.

2. Description of the Related Art

Portable electronics devices, such as mobile phones, personal digital assistants (PDAs), digital video cameras (DVCs), and digital still cameras (DSCs) have become increasingly sophisticated. A further reduction in size and weight is, however, necessary for such devices to continue to succeed in the market, and as such, these devices now require highly integrated system LSI chips. User-friendliness and convenience is required for these devices as well, resulting in an increased need for highly functional high performance LSI chips. Although the highly integrated LSI chips require a large number of input/output ports, there is a strong desire to reduce their package size. To meet these conflicting requirements, the development of a semiconductor package suitable for high density board packaging of semiconductor parts is strongly desired. In response to such needs, a variety of packaging technologies, called chip size package (CSP) technologies, have been developed.

A CSP is formed in such a way that a semiconductor wafer (semiconductor substrate), in which LSI chips (circuit elements) and external connecting terminals connected to each LSI chip are formed on one principal surface thereof, is diced into individual chips. Accordingly, the CSP, which is substantially the same size as an LSI chip, is fixed on a mounting board, resulting in a reduction in the size of the mounting board on which the CSP is mounted. Therefore, the use of the CSP in a system allows the overall size of that system, such as an electronics device, to be reduced.

Moreover, power consumption of LSI chips is increasing every year with the associated increase in performance and functionality. This leads to an increase in the power consumption per unit volume (heat density) of a CSP (semiconductor module) with an LSI chip, resulting in a greater need for radiation of the extra heat away from the CSP. One proposed approach to this issue is a method for effectively radiating out heat generated in the CSP (semiconductor module) through a film which is formed on the rear surface of a semiconductor substrate, which is a component of the CSP (semiconductor module). Such a film is a heat radiative film with a high thermal emissivity, e.g., a film containing ceramic powder, or a heat conductive film with a high thermal conductivity, e.g., copper or aluminum.

In general, a radiator, and especially a heat conductive film, used in the CSP (semiconductor module) is subjected to internal stress in the extending direction of the radiator during the process of formation. The internal stress is retained in the radiator of each individual CSP after formation. This stress causes the radiator to be separated from the semiconductor substrate, resulting in reduced reliability of the CSP (semiconductor module). In particular, there is a high possibility of separation of the radiator from the semiconductor substrate when the CSP (semiconductor module) is heated.

If the development of a thinner semiconductor substrate progresses in the future facilitating a reduction in the thickness of the CSP (semiconductor module), the remaining internal stress in the radiator will have a significant relative impact on the thinned semiconductor substrate. Accordingly, for example, the remaining internal stress in the radiator greater than the stiffness of the semiconductor substrate may cause the CSP (semiconductor module) together with the semiconductor substrate to change shape and thus to warp, even if there is no separation of the radiator from the semiconductor substrate.

SUMMARY OF THE INVENTION

The present invention has been developed in view of the foregoing facts and a general purpose thereof is to increase the heat radiation of the semiconductor module by suppressing the reducing in reliability caused by the radiator.

To solve the aforementioned problems, a semiconductor module according to one embodiment of the present invention comprises: a semiconductor substrate with a first principal surface on which a circuit element is provided and a second principal surface opposing the first principal surface; an electrode provided on the first principal surface with the electrode being electrically connected to the circuit element; an insulating layer provided on the second principal surface; a radiator provided on the insulating layer; and a projection provided integrally with the radiator, with the projection penetrating the insulating layer to connect to the second principal surface.

According to this configuration, the projection integrally formed with the radiator reduces the internal stress of the radiator in the extending direction of the radiator, thereby suppressing the tendency of the radiator to warp. This in turn leads to a reduction in the problems of separation of the radiator from the semiconductor substrate and warpage (deformation) of the semiconductor substrate in the semiconductor module having the radiator provided thereon when compared with conventional semiconductor modules. Moreover, the projection, which conducts heat from the semiconductor substrate to the radiator to radiate out heat, improves the heat radiation of the semiconductor module when compared with a radiator, without such a projection, connected to a semiconductor substrate through an insulating layer. Accordingly, this semiconductor module can suppress the reduction in reliability caused by the radiator and improve the heat radiation.

In the foregoing configuration, it is preferable that a plurality of the projections be arranged on the radiator in a matrix array in plane. This arrangement effectively reduces the internal stress of the radiator, thus further increasing the reliability of the semiconductor module.

In the foregoing configuration, it is preferable that the tops of the projections be embedded in the semiconductor substrate. The tips of the projections embedded in the semiconductor substrate prevent relative displacement between the semiconductor substrate and the radiator even when a shearing stress is applied therebetween, thus further increasing the reliability of the connection between the semiconductor substrate and the radiator.

In the foregoing configuration, a gap may be formed between the insulating layer and the radiator, except for the projection.

Also in the foregoing configuration, the radiator may be patterned so as to selectively cover a specific region of the semiconductor substrate. Part of the pattern may be used as a wiring platform. This in turn allows part of the radiator to be used as a wiring platform, improving the design freedom of the wiring and thus reducing the size of the semiconductor module. The insulating layer may be made of an insulating resin which is a material that undergoes plastic flow when placed under pressure, and the projections may penetrate the insulating layer by compression-bonding the radiator onto the insulating layer to thermally connect the projections to the circuit element.

Another embodiment of the present invention is a portable device. The portable device comprises a casing and any one of the above-mentioned semiconductor modules housed in the casing. In the portable device having the above-detailed configuration, the radiator of the semiconductor module may come into contact with an inner surface of the casing.

Another embodiment of the present invention is a method for manufacturing a semiconductor module. The method comprises: preparing a semiconductor substrate provided with a circuit element on a first principal surface; forming an insulating layer having an opening on a second principal surface of the semiconductor substrate; and forming a radiator integrally provided with a projection by filling the opening with a metal and by coating the opening and an upper portion of the insulating layer with the metal.

Yet another embodiment of the present invention is a method for manufacturing a semiconductor module. The method comprises: preparing a semiconductor substrate provided with a circuit element on a first principal surface; forming an insulating layer on a second principal surface of the semiconductor substrate; and compression-bonding a radiator integrally provided with a projection to the second principal surface of the semiconductor substrate and bringing the projection penetrating the insulating layer into contact with the second principal surface of the semiconductor substrate. In the method for manufacturing a semiconductor module detailed above, the insulating layer may be adhesive.

In the method for manufacturing a semiconductor module detailed above, the insulating layer may be made of an insulating resin which is a material that undergoes plastic flow when placed under pressure. The method for manufacturing a semiconductor module may further comprise patterning the radiator by selectively removing a portion of the radiator. In the method for manufacturing a semiconductor module detailed above, the radiator that is compression-bonded to the second surface of the semiconductor substrate may be patterned in advance. In the method for manufacturing a semiconductor module detailed above, the insulating layer may be adhesive.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
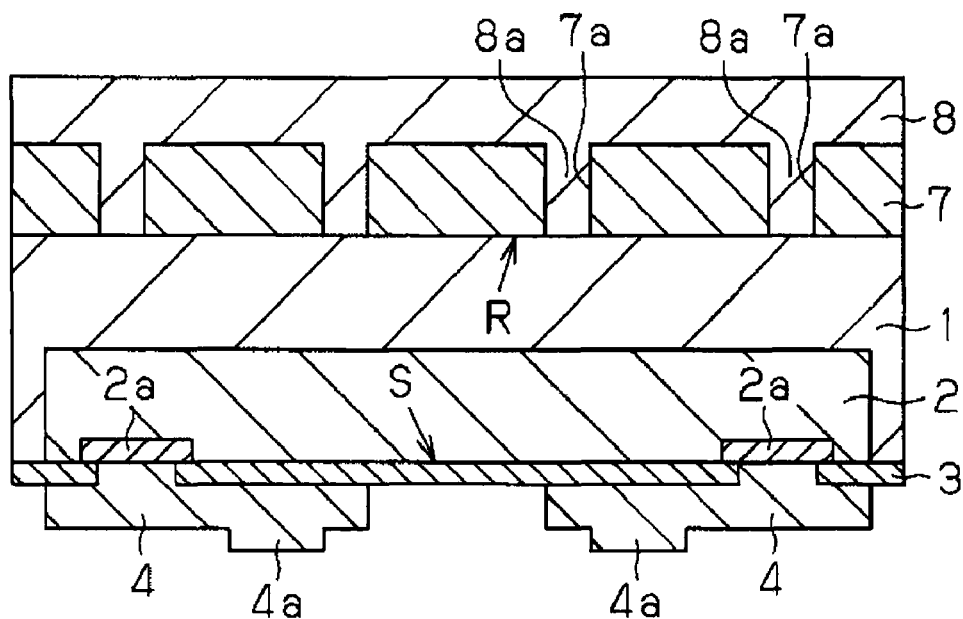
FIG. 1 is a schematic cross-sectional view of a semiconductor module according to a first embodiment of the present invention.

The invention will now be described by reference to the preferred embodiments. This does not intend to limit the scope of the present invention, but to exemplify the invention.

Exemplified embodiments of the present invention will be described below with reference to the drawings. Note that the same components as those in all drawings are denoted by the same reference characters, and their descriptions will not be repeated accordingly.

First Embodiment

FIG. 1 is a schematic cross-sectional view of a semiconductor module according to a first embodiment of the present invention. The semiconductor module according to the first embodiment will be described with reference to FIG. 1.

A semiconductor substrate 1 is, for example, a p-silicon substrate, which has a surface S (lower surface) on which a circuit element 2, such as a predetermined electrical circuit, is formed by a technique well-known to those skilled in the art and on which electrodes 2a of the circuit element 2 are formed (circumferentially). A protective film 3 is formed on all regions of the surface of the semiconductor substrate 1 except the electrodes 2a. A re-wiring pattern 4 connected to exposed faces of the electrodes 2a and electrodes 4a which are integrally provided with the re-wiring pattern 4 are formed to ensure that the pitch of the electrodes 2a is sufficiently large.

Note that the semiconductor substrate 1, the circuit element 2, the surface S, and the electrodes 4a are examples of the "semiconductor substrate," the "circuit element," the "first principal surface," and the "electrodes" of the present invention, respectively.

An insulating layer 7 is formed on the rear surface R (upper surface) of the semiconductor substrate 1. The insulating layer 7 is an epoxy resin based film, and is, for example, approximately 100 μm thick. The epoxy resin based insulating layer 7 may be a film of tangled glass fibers impregnated with resin or a film to which fillers with a diameter in the range of approximately 2 μm to 10 μm are added. The fillers may be, for example, alumina ($Al_2O_3$), silica ($SiO_2$), aluminum nitride (AlN), silicon nitride (SiN), or boron nitride (BN). Such fillers preferably have a mass filling factor in the range of approximately 30% to 80%. It is desirable that the insulating layer 7 be adhesive in order to prevent a radiator 8 described later from being separated from the semiconductor substrate 1.

A plurality of openings 7a are formed in the insulating layer 7 at predetermined intervals, e.g., approximately 300 μm apart. The openings 7a have a diameter of approximately 60 μm and pass through the insulating layer 7 in the thickness direction. These openings 7a are arranged in a matrix array over the plane of the radiator 8 to effectively reduce the internal stress of the radiator 8. The matrix array is, for example, a square lattice or a honeycomb lattice (being a hexagonal grid and associated centers). Note that the rear surface R and the insulating layer 7 are examples of the "second principal surface" and the "insulating layer" of the present invention, respectively.

Figure 2A:
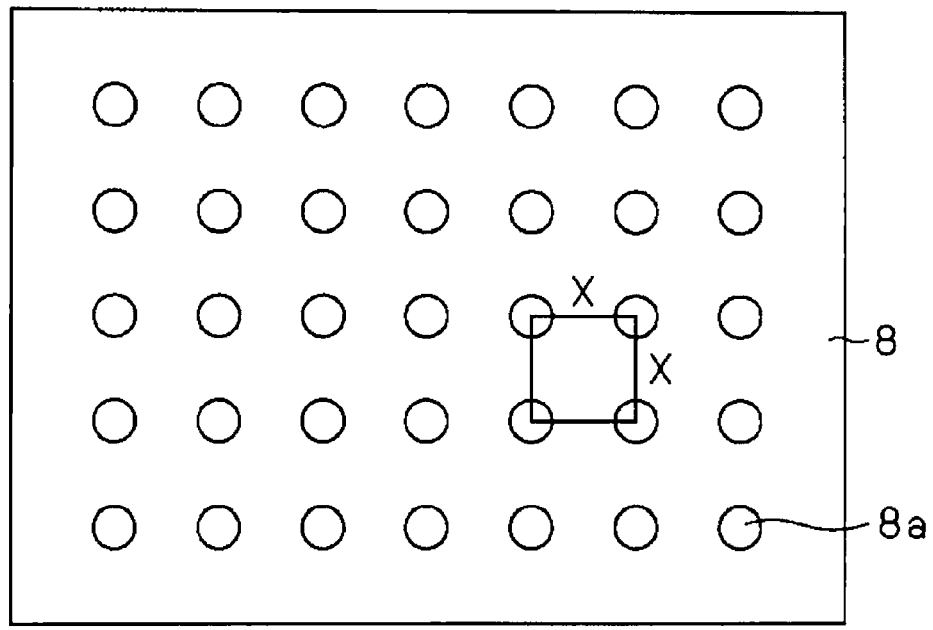
FIGS. 2A and 2B are plan views showing an arrangement of projections provided on a radiator as shown in FIG. 1.
Figure 2B:
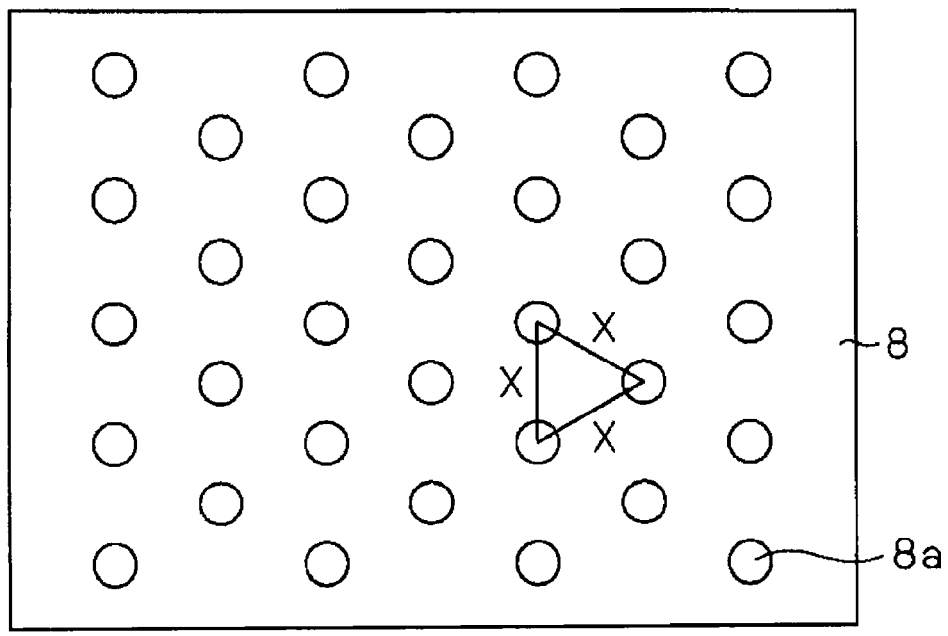

The radiator 8 is formed on the insulating layer 7. Projections 8a formed in the openings 7a, which pass through the insulating layer 7, are integrally provided with the radiator 8. The radiator 8 and the projections 8a are formed of, for example, a metal film such as copper or aluminum. The radiator 8 is, for example, approximately 100 μm thick. The radiator 8 covers the majority of the rear surface R of the semiconductor substrate 1. The tops of the projections 8a does, however, come into direct contact with the rear surface R of the semiconductor substrate 1. This arrangement allows the projections 8a to be thermally connected to the semiconductor substrate 1, and thus the projections 8a conduct heat from the semiconductor substrate 1 toward the radiator 8, so that the heat of the semiconductor substrate 1 is effectively radiated away. The projections 8a each have a round section with a diameter of approximately 60 μm, and correspond to the respective openings 7a. Accordingly, the projections 8a are arranged on the radiator 8 in a matrix array in plane, like the openings 7a. Specifically, the projections 8a are arranged in a square lattice, as shown in FIG. 2A, or in a honeycomb lattice, as shown in FIG. 2B, at equal intervals (interval X). Note that the radiator 8 and the projections 8a are examples of the "radiator" and the "projections" of the present invention, respectively.

Manufacturing Method

FIGS. 3A to 3D and 4A to 4C are cross-sectional views illustrating the process of manufacturing the semiconductor module according to the first embodiment shown in FIG. 1. The process of manufacturing the semiconductor module according to the first embodiment will now be described with reference to FIGS. 1, 3A to 3D, and 4A to 4C.

Figure 3A:
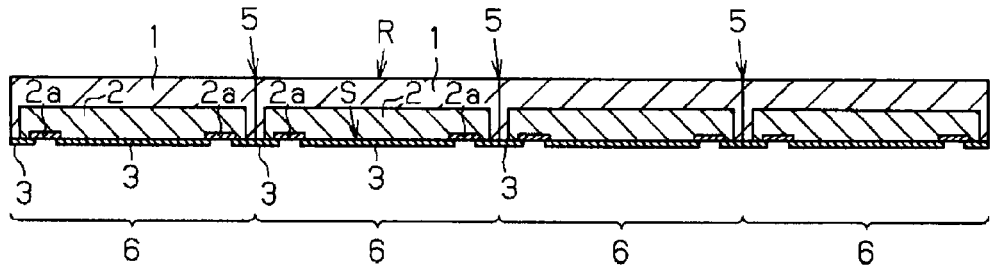
FIGS. 3A to 3D are schematic cross-sectional views showing a manufacturing process of the semiconductor module according to the first embodiment of the present invention.

As shown in FIG. 3A, a semiconductor wafer on which the semiconductor substrates 1 are arranged in a matrix array is prepared. Each semiconductor substrate 1 includes the electrodes 2a of the circuit element 2 and the protective film 3, which are formed on the surface S. The semiconductor wafer is sectioned into a plurality of semiconductor module regions 6 by a plurality of scribe lines 5. Each of the semiconductor module regions 6 is a region on which the semiconductor module described above is formed. Specifically, the circuit element 2, such as a predetermined electrical circuit, is formed on the surface S (lower surface) by a technique well-known to those skilled in the art, and the electrodes 2a are formed on or around the circuit element 2. The electrodes 2a are generally made of a metal such as aluminum (Al). The protective film 3 is formed on all regions of the surface S of the semiconductor substrate 1 except the electrodes 2a in order to protect the semiconductor substrate 1. The protective film 3 is made of, for example, silicon dioxide film ($SiO_2$) or silicon nitride film (SiN).

Figure 3B:
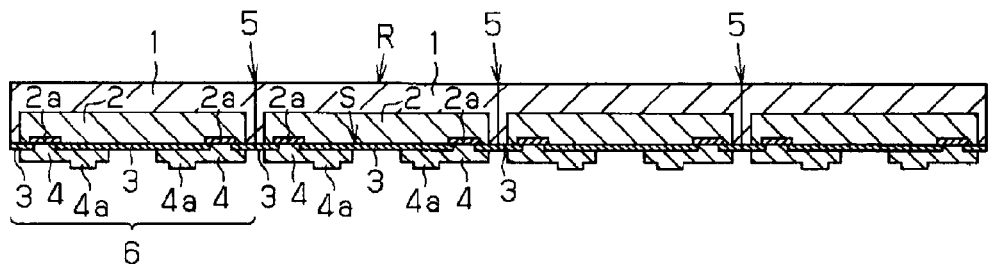

As shown in FIG. 3B, the re-wiring pattern 4 made of copper (Cu) and the electrodes 4a which are integrally provided with the re-wiring pattern 4 are formed so as to be connected to the exposed faces of the electrodes 2a to ensure that the pitch of the electrodes 2a is large enough. In this instance, the re-wiring pattern 4 and the electrodes 4a are formed in a desired pattern in such a manner that the processes of resist pattern forming, copper plating, and resist stripping are repeated twice. Integrally forming the electrodes 4a with the re-wiring pattern 4 eliminates the need for connection between different materials in the path from the electrodes 2a of the circuit element 2 to the electrodes 4a. Accordingly, this configuration has less potential for an adverse effect such as disconnection even when thermal stress is applied due to variations in temperature and the like during use of the semiconductor module.

Figure 3C:
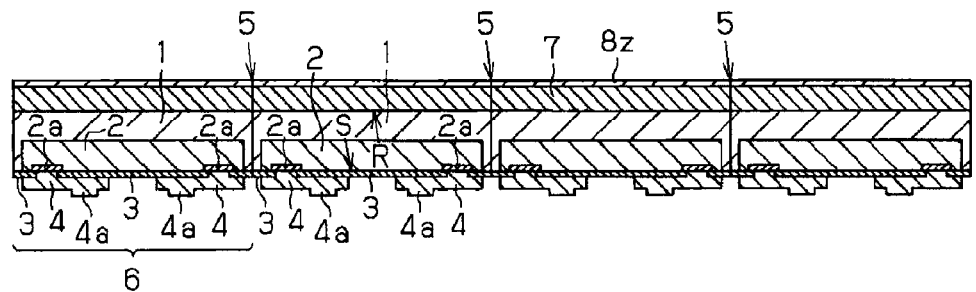

As shown in FIG. 3C, the insulating layer 7 with a copper foil 8z is thermocompression-bonded to the rear surface R (upper surface) of the semiconductor substrate 1 (semiconductor wafer) under vacuum or low pressure. The insulating layer 7 is, for example, approximately 100 μm thick, and the copper foil 8z is, for example, approximately 10 μm thick. The insulating layer 7 is made of the same material as that described above. The insulating layer 7, when formed from a film with a high heat conductivity such as a film of tangled glass fibers impregnated with resin or a film to which fillers are added, conducts heat of the semiconductor substrate 1 to the radiator 8, thereby improving the heat radiation of the semiconductor module.

Figure 3D:
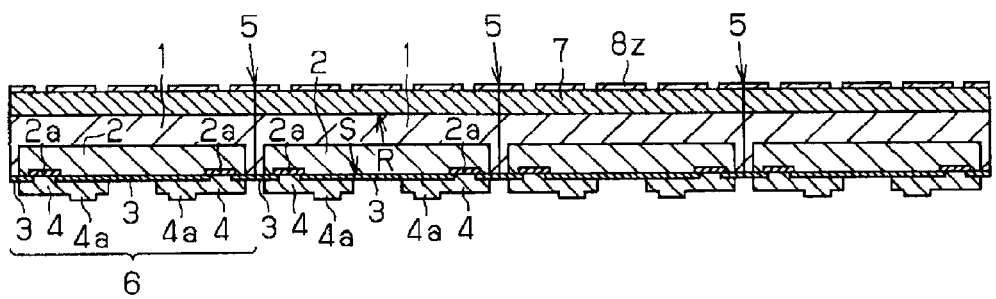

As shown in FIG. 3D, parts of the copper foil 8z, which are located on the regions of the openings 7a (see FIG. 1), are removed by photolithography and etching techniques, so that the regions of the insulating layer 7 corresponding to the openings 7a are exposed.

Figure 4A:
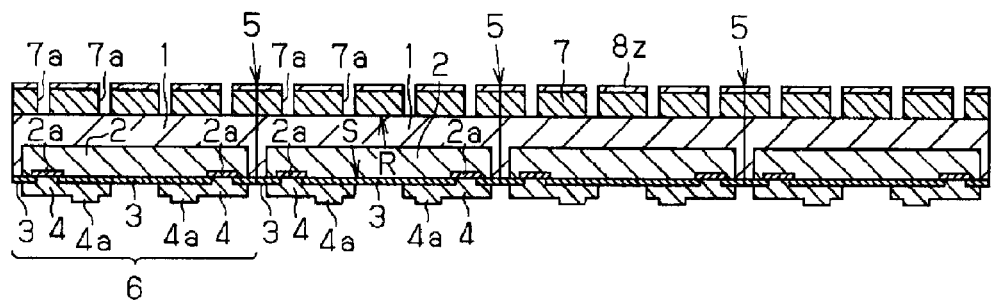
FIGS. 4A to 4C are schematic cross-sectional views showing the manufacturing process of the semiconductor module according to the first embodiment of the present invention.

After that, as show in FIG. 4A, the regions extending from the exposed face of the insulating layer 7 to the rear surface R of the semiconductor substrate 1 are removed by irradiation using a carbon dioxide gas laser or a UV laser directed from above the copper foil 8z. Accordingly, the openings 7a, which have a diameter of approximately 60 μm and pass through the insulating layer 7, are formed in the insulating layer 7.

Figure 4B:
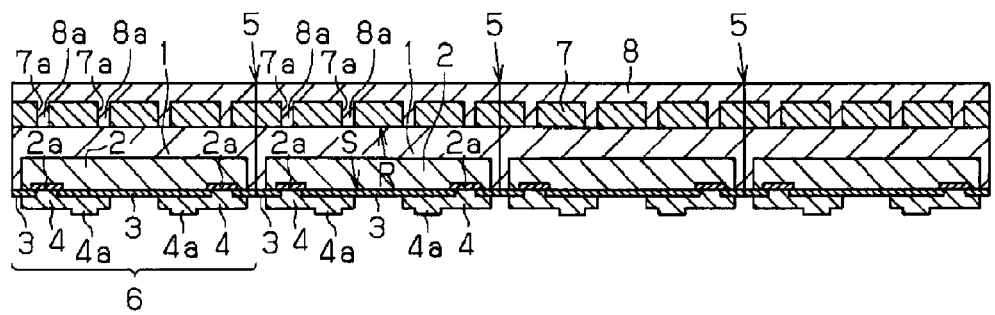

As shown in FIG. 4B, copper is plated to a thickness of approximately 1 μm on the surface of the copper foil 8z and the inner surface of the openings 7a by nonelectrolytic plating. Following this, copper is plated on the surface of the copper foil 8z and the inside of the openings 7a by electrolytic plating. In this embodiment, an inhibitor and a promoter are added to the plating solution so that the surface of the copper foil 8z adsorbs the inhibitor and the inner surface of the openings 7a adsorbs the promoter. This adsorption allows copper to be more thickly plated on the inner surface of the openings 7a, therefore filling the openings 7a with copper. Consequently, as shown in FIG. 4B, the radiator 8 with a thickness of approximately 100 µm above the insulating layer 7 is formed to cover the majority of the semiconductor substrate 1 (semiconductor wafer), and the projections 8a are embedded in the openings 7a. In other words, the projections 8a are integrally formed with the radiator 8 and penetrate the insulating layer 7 so that the tip of the projections 8a come into direct contact with the rear surface R of the semiconductor substrate 1 (semiconductor wafer).

Figure 4C:
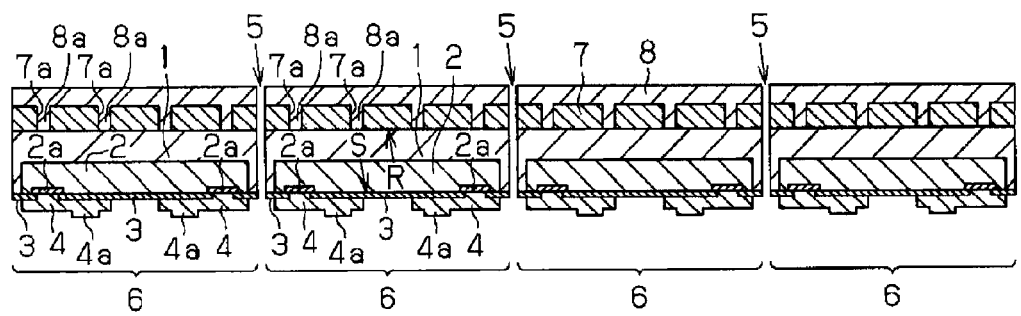

As shown in FIG. 4C, the semiconductor wafer is diced from above the rear surface R (upper surface) of the semiconductor wafer along the scribe lines 5 for sectioning the semiconductor module regions 6 in order to obtain individual semiconductor modules having the same outside dimension as that of the semiconductor substrate 1. After that, any residue caused by dicing is removed by rinsing the semiconductor module with a chemical. At this time, the small amount of the insulating layer 7 that is exposed at the side wall of the semiconductor module is removed, so that the surface area of the radiator 8 increases. Accordingly, the heat radiation of the radiator 8 is improved compared with the case without rinsing with the chemical. If the side surface of the radiator 8 and the side surface of the semiconductor substrate 1 are irregularly processed to increase their surface areas, the heat radiation at the irregular surfaces increases and thus the heat radiation of the semiconductor module is improved.

The semiconductor module according to the first embodiment shown in FIG. 1 is manufactured by the above-detailed processes.

The semiconductor module and the manufacturing method therefor according to the first embodiment as described above have the following advantages:

(1) The warpage of the radiator 8 is suppressed because the projections 8a integrally formed with the radiator 8 reduce the internal stress of the radiator 8 in the extending direction of the radiator 8. This in turn leads to a reduction in the problems of separation of the radiator 8 from the semiconductor substrate 1 and warpage (deformation) of the semiconductor substrate 1 in the semiconductor module having the radiator 8 provided on the semiconductor substrate 1 when compared with conventional semiconductor modules. Moreover, the projections 8a, which conduct heat from the semiconductor substrate 1 toward the radiator 8 to radiate out the heat, improve the heat radiation of the semiconductor module when compared with a radiator without such projections which is connected to a semiconductor substrate through an insulating layer. Accordingly, this semiconductor module can suppress the reduction in reliability caused by the radiator 8 and improve the heat radiation.

(2) The projections 8a are arranged on the radiator 8 in a matrix array in plane to effectively reduce the internal stress of the radiator 8, thus further increasing the reliability of the semiconductor module.

(3) The projections 8a, which connect the radiator 8 and the semiconductor substrate 1, conduct heat from the semiconductor substrate 1 toward the radiator 8. Hence, the heat may cause the radiator 8 to extend. However, the projections 8a reduce an effect of the extension on the semiconductor substrate 1, i.e., a difference in extended amount between the radiator 8 and the semiconductor substrate 1, thus improving the reliability of the semiconductor module when compared with the conventional semiconductor modules.

(4) The radiator 8 and the other elements are collectively formed on the semiconductor wafer before the semiconductor wafer is sectioned into individual semiconductor modules, thereby reducing the manufacturing cost of each semiconductor module when compared with the case where the radiator 8 and the other elements are formed for each semiconductor module.

Second embodiment

Figure 5:
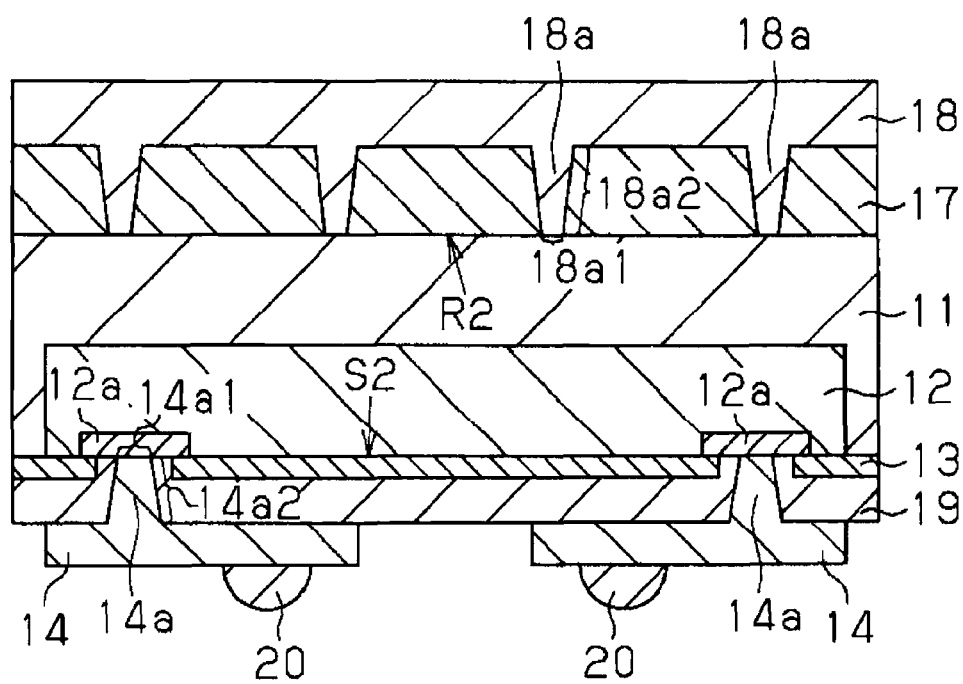
FIG. 5 is a schematic cross-sectional view of a semiconductor module according to a second embodiment of the present invention.

FIG. 5 is a schematic cross-sectional view of a semiconductor module according to a second embodiment of the present invention. The semiconductor module according to the second embodiment will be described with reference to FIG. 5.

A semiconductor substrate 11 is, for example, a p-silicon substrate, which has a surface S2 (lower surface) on which a circuit element 12, such as a predetermined electrical circuit, is formed by a technique well-known to those skilled in the art and on which electrodes 12a of the circuit element 12 are formed (circumferentially). A protective film 13 is formed on all regions of the surface of the semiconductor substrate 11 except the electrodes 12a. Note that the semiconductor substrate 11, the circuit element 12, and the surface S2 are examples of the "semiconductor substrate," the "circuit element," and the "first principal surface" of the present invention, respectively.

An insulating layer 17 is formed on a rear surface R2 (upper surface) of the semiconductor substrate 11, and is, for example, approximately 100 µm thick. The insulating layer 17 is made from a material that undergoes plastic flow when placed under pressure. A material that undergoes plastic flow when placed under pressure includes an epoxy-based thermosetting resin. The epoxy-based thermosetting resin used as the insulating layer 17 may be a material which has a viscosity of 1 kpa·s at a temperature of 160° C. and a pressure of 8 MPa, for example. The viscosity of the resin decreases to about ⅛ when the material is pressurized to 15 MPa at a temperature of 160° C. when compared with the case of a resin not being pressurized. Conversely, B-stage epoxy resin under the condition of the glass transition temperature Tg or less before thermal cure has a viscosity as small as that when the resin is not pressurized, and there is no change in viscosity even if the resin is pressurized. Note that the rear surface R2 and the insulating layer 17 are examples of the "second principal surface" and the "insulating layer" of the present invention, respectively.

A radiator 18 is formed on the insulating layer 17, and is integrally provided with projections 18a which penetrate the insulating layer 17.

The radiator 18 and the projections 18a are made of, for example, a metal film such as copper. The radiator 18 is, for example, approximately 100 µm thick, and the projections 18a are, for example, approximately 100 µm in height. As a result, the distance between the surface of the radiator 18 and the tip of the projection 18a which contacts to the rear surface R2 is, for example, approximately 200 µm. The radiator 18 is provided to cover the entire rear surface R2 of the semiconductor substrate 11. The projections 18a each have a round section and each comprises a top portion 18a1 and a side portion 18a2. The tip portion 18a1 is in parallel with the contact face of the semiconductor substrate 11. The side portion 18a2 is formed so that the projection 18a tapers toward the top portion 18a1. The tops (top portion 18a1) and the bases of the projections 18a are approximately 40 µmφ and approximately 60 µmφ in diameter, respectively. Moreover, a plurality of the projections 18a is arranged on the radiator 18 in a matrix array in plane. The matrix array may include, for example, a square lattice or a honeycomb lattice, as shown in FIGS. 2A and 2B of the above-described first embodiment. The projections 18a are formed at predetermined intervals, for example, approximately 300 µm. The tops (top portion 18a1) of the projections 18a are formed so as to come into direct contact with the rear surface R2 of the semiconductor substrate 11. This arrangement allows the projections 18a to be thermally connected to the semiconductor substrate 11, and thus heat is conducted away from the semiconductor substrate 11 toward the radiator 18 through the projections 18a, so that the heat of the semiconductor substrate 11 is effectively radiated away. Note that the radiator 18 and the projections 18a are examples of the "radiator" and the "projections" of the present invention, respectively.

In the surface S2 (lower surface) of the semiconductor substrate 11, the insulating layer 19 is formed on the electrodes 12a and the protective film 13 to ensure that the pitch of the electrodes 12a is sufficiently large. Projecting conductors 14a and re-wiring patterns 14 are formed. In this instance, the projecting conductors 14a penetrate the insulating layer 19 so as to come into contact with the exposed faces of the electrodes 12a. The re-wiring patterns 14 are integrally provided with the conductors 14a. Electrodes (being solder bumps) 20 are provided on the outer side (being lower surface) of the re-wiring patterns 14 where the electrodes 12a are connected through the conductors 14a. The electrodes 20 are one example of the "electrodes" of the present invention.

The insulating layer 19 is made of the same material as the insulating layer 17, and is, for example, approximately 60 µm thick.

The re-wiring patterns 14 are formed on the insulating layer 19, and integrally provided with the projecting conductors 14a which penetrate the insulating layer 19. The re-wiring patterns 14 and the conductors 14a are made of, for example, a metal such as copper, which has been rolled out. The rolled copper exhibits excellent mechanical strength and thus is suitable as a re-wiring material, when compared with a copper film formed by a plating process. The re-wiring patterns 14 are, for example, approximately 30 µm thick, and the conductors 14a are, for example, approximately 60 µm in height (thickness). The conductors 14a each have a round section and each comprises a top portion 14a1 and a side portion 14a2. The top portion 14a1 is in parallel with the contact face of the electrode 12a of the semiconductor substrate 11. The side portion 14a2 is formed so that the conductor 14a tapers toward the top portion 14a1. The tops (top portion 14a1) and the bases of the conductors 14a are approximately 40 µmφ and approximately 60 µmφ in diameter, respectively. Moreover, the conductors 14a are arranged at the positions corresponding to the electrodes 12a, respectively. The tops (top portion 14a1) of the conductors 14a are formed so as to come into direct contact with the electrodes 12a of the semiconductor substrate 11, and thus electrically connect the electrodes 12a and the re-wiring patterns 14.

Manufacturing Process

FIGS. 6A to 6D are schematic cross-sectional views illustrating one method for forming a copper plate being integrally formed with projections. FIGS. 7A to 7D and FIGS. 8A to 8D are schematic cross-sectional views illustrating a manufacturing process of the semiconductor module according to the second embodiment as shown in FIG. 5. The manufacturing process of the semiconductor module according to the second embodiment will now be described with reference to FIG. 5 to FIG. 8D.

Figure 6A:
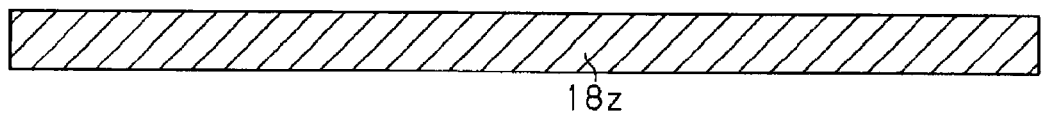
FIGS. 6A and 6D are schematic cross-sectional views showing a method for forming a copper plate integrally formed with projections according to the second embodiment of the present invention.

As shown in FIG. 6A, a copper plate 18z which has a thickness that is at least greater than the combined height of the projections 18a and the radiator 18 is prepared. In this instance, the copper plate 18z is approximately 300 µm thick. Rolled copper is used as the copper plate 18z.

Figure 6B:
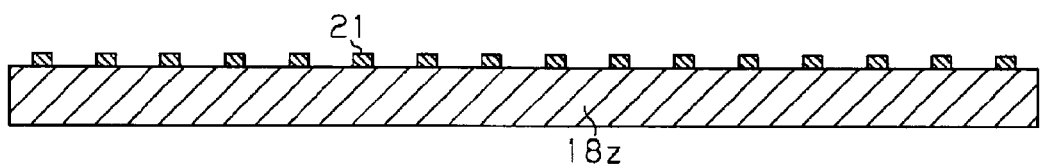

As shown in FIG. 6B, a resist mask 21 is formed in the projection formation area using a standard lithography method. The projection formation area is as shown in the above-mentioned figures.

Figure 6C:
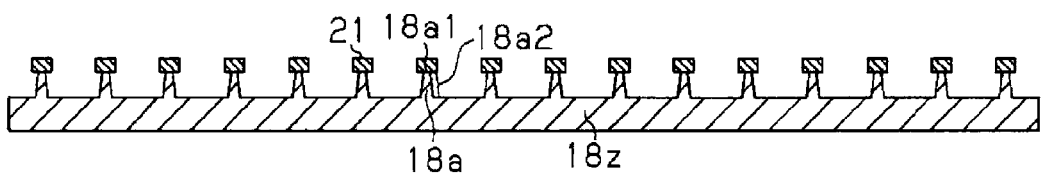

As shown in FIG. 6C, the projections 18a of the predetermined pattern are formed into the copper plate 18z by etching with the resist mask 21 used as a mask. Adjusting the etching conditions allows the formation of the side portion 18a2 in which the projection 18a tapers toward the top portion 18a1. In this instance, the projections 18a are approximately 100 µm in height, and the tops (top portion 18a1) and the bases of the projections 18a are approximately 40 µmφ and approximately 60 µmφ in diameter, respectively.

Figure 6D:
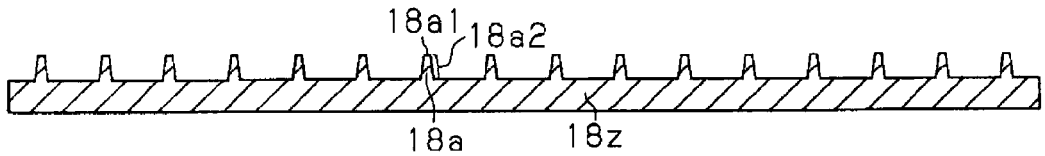

As shown in FIG. 6D, the resist mask 21 is then removed. As a result of this process, the projections 18a, each having the top portion 18a1 and the side portion 18a2 formed so that the projection 18a tapers toward the top portion 18a1, are formed in the copper plate 18z. A metal mask such as silver (Ag) may be used in place of the resist mask 21. In this instance, the metal mask can ensure a high etching selectivity with respect to the copper plate 18z, thereby making the projections 18a more finely patterned.

The copper plate 14z integrally formed with the projecting conductors 14a is formed by the method described above. As a result, the conductors 14a, each having a top portion 14a1 and a side portion 14a2 formed so that the conductor 14a tapers toward the top portion 14a1, are formed. In this instance, the projecting conductors 14a are approximately 60 µm in height, and the tops (top portion 14a1) and the bases of the conductors 14a are approximately 40 µmφ and approximately 60 µmφ in diameter, respectively.

These copper plates 18z and 14z, being manufactured as detailed above, are separately prepared, and are then used for the manufacturing process for the semiconductor module according to the second embodiment, which will be described below.

Figure 7A:
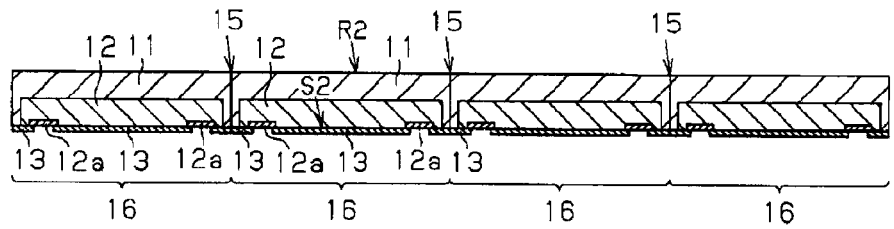
FIGS. 7A to 7D are schematic cross-sectional views showing a manufacturing process of the semiconductor module according to the second embodiment of the present invention.

As shown in FIG. 7A, the semiconductor wafer, in which the semiconductor substrates 11 with the electrodes 12a and the protective film 13 on the surface S2 thereof are arranged in a matrix array, is first prepared. It should be appreciated that the semiconductor wafer has been sectioned into a plurality of semiconductor module regions 16 by a plurality of scribe lines 15. Each of the semiconductor module regions 16 is a region where the semiconductor module described above is to be formed. Specifically, a semiconductor substrate 11 is, for example, a p-silicon substrate or other semiconductor wafer. The substrate 11 has a surface S2 (lower surface) on which a circuit element 12, such as a predetermined electrical circuit, is formed and electrodes 12a are formed circumferentially with respect to the circuit element 12 or above the element 12 by a technique well-known to those skilled in the art. The electrodes 12a are generally made of a metal such as aluminum (Al). The protective film 13 is formed on all regions of the surface S2 of the semiconductor substrate 11 except the electrodes 12a in order to protect the semiconductor substrate 11. The protective film 13 is made of, for example, silicon dioxide film ($SiO_2$) or silicon nitride film (SiN).

Figure 7B:
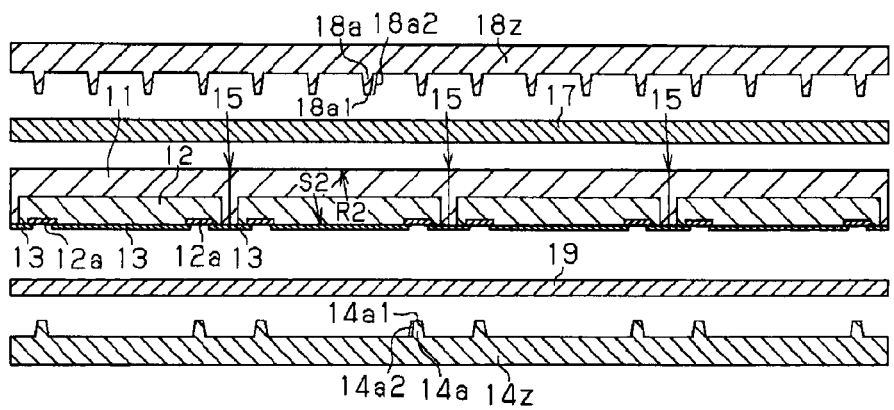

As shown in FIG. 7B, the insulating layer 17 is located between the semiconductor substrate 11 and the copper plate 18z integrally formed with the projections 18a. This combination is formed on the rear surface R2 (upper surface) of the semiconductor wafer (semiconductor substrate 11). The thickness of the insulating layer 17 is approximately 100 µm, which is the same as the height of the projections 18a. The insulating layer 19 is located between the semiconductor substrate 11 and the copper plate 14z integrally formed with the projecting conductors 14a. This combination is formed on the surface S2 (lower surface) of the semiconductor wafer (semiconductor substrate 11). The thickness of the insulating layer 19 is approximately 60 μm, which is the same as the height of the conductors 14a. The copper plate 18z, which is integrally formed with the projections 18a, and the copper plate 14z, which is integrally formed with the projecting conductors 14a, are formed as described above. The insulating layers 17 and 19 are preferably adhesive, so that the radiator 18 and the re-wiring pattern 14 described later are prevented from being separated from the semiconductor substrate 11.

Figure 7C:
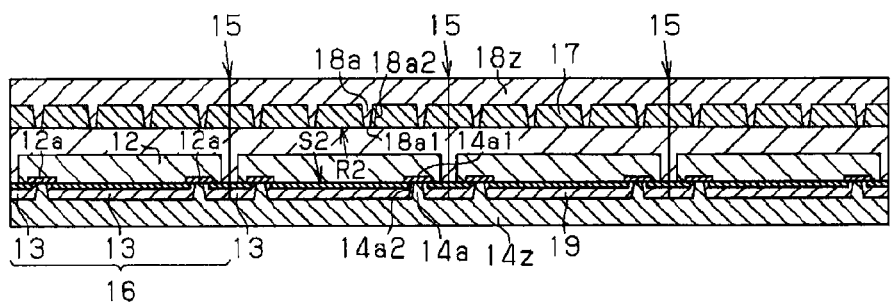

As shown in FIG. 7C, the copper plate 18z, the insulating layer 17, the semiconductor substrate 11, the insulating layer 19, and the copper plate 14z, with these elements being sandwiched as described above, are integrated by compression molding with a pressure device. The press working is performed at a pressure of approximately 15 MPa and a temperature of 180° C. This press working makes the projections 18a penetrate the insulating layer 17, so that the projections 18a are connected to the rear surface R2 of the semiconductor substrate 11. At the same time, the projecting conductors 14a penetrate the insulating layer 19, so that the conductors 14a are electrically connected to the electrodes 12a of the semiconductor substrate 11. The side portion 18a2 (side portion 14a2), which is formed so that the projection 18a (conductor 14a) tapers toward the top portion 18a1 (top portion 14a1), allows the projections 18a (conductors 14a) to smoothly penetrate the insulating layer 17 (insulating layer 19).

The pressure at the press working lowers the viscosity of the insulating layer 17 (insulating layer 19), thereby causing plastic flow of the insulating layer 17 (insulating layer 19). As a result, the insulating layer 17 (insulating layer 19) is pushed out of the interface between the projections 18a (conductors 14a) and the rear surface R2 of the semiconductor substrate 11 (electrodes 12a of the semiconductor substrate 11), so that part of the insulating layer 17 (insulating layer 19) is hard to remain in the interface.

Figure 7D:
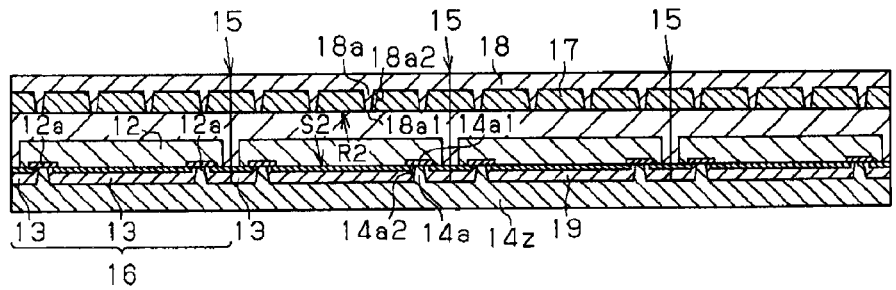

As shown in FIG. 7D, the entire copper plate 18z is etched so as to have the same thickness as the radiator 18. The radiator 18 in the present embodiment is approximately 100 μm thick. Accordingly, the radiator 18, which is integrally provided with the projections 18a penetrating the insulating layer 17, is formed on the insulating layer 17.

Figure 8A:
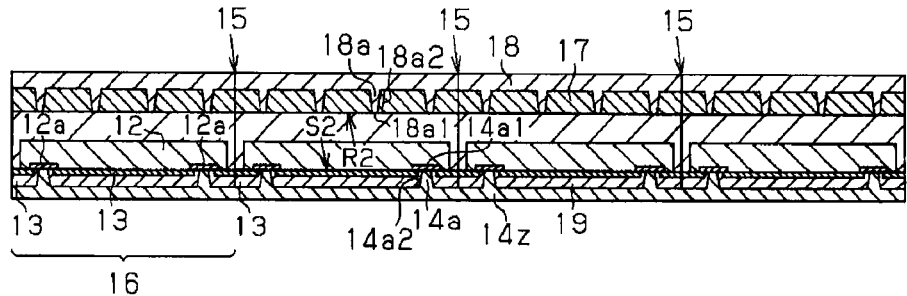
FIGS. 8A to 8D are schematic cross-sectional views showing the manufacturing process of the semiconductor module according to the second embodiment of the present invention.

As shown in FIG. 8A, the entire copper plate 14z is then etched so as to have the same thickness as the re-wiring pattern 14. The re-wiring pattern 14 in the present embodiment is approximately 30 μm thick.

Figure 8B:
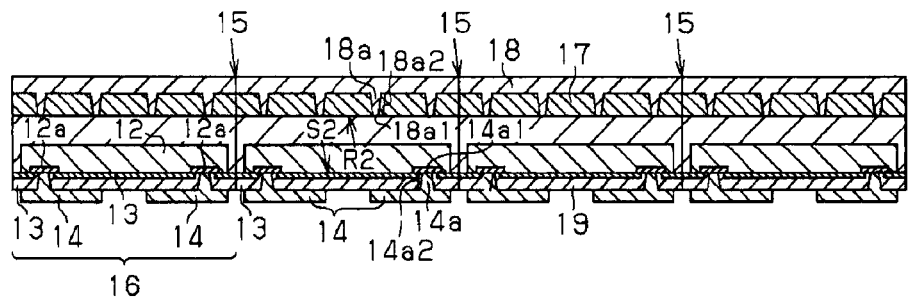

As shown in FIG. 8B, the copper plate 14z is etched into the re-wiring pattern 14 by photolithography and etching techniques.

Figure 8C:
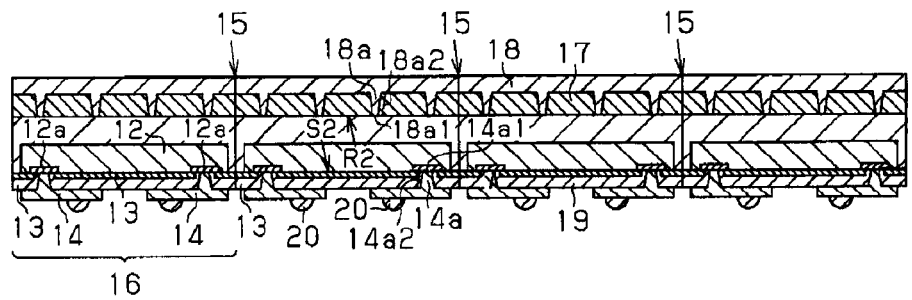

As shown in FIG. 8C, electrodes 20 (being solder balls), which function as external connecting terminals of the re-wiring pattern 14 to which the electrodes 12a are connected through the conductors 14a, are formed by the solder print method. Specifically, the electrodes 20 (being solder balls) are formed by printing, using a screen mask on the portions desired, a "solder paste" made of a paste of resin and a solder material, and by heating at the solder melting point. Alternatively, flux may be applied on the re-wiring pattern 14 beforehand, and solder balls are then mounted directly onto the re-wiring pattern 14.

Figure 8D:
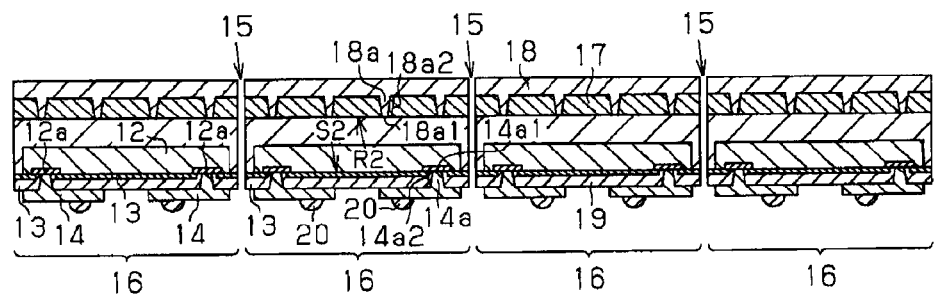

As shown in FIG. 8D, the semiconductor wafer is diced from above the rear surface R2 (upper surface) of the semiconductor wafer along the scribe lines 15 for sectioning the semiconductor module regions 16 in order to obtain individual semiconductor modules having the same outside dimension as that of the semiconductor substrate 11. After that, any residue caused by dicing is removed by rinsing the semiconductor module with a chemical.

The semiconductor module according to the second embodiment, as shown in FIG. 5, is manufactured by the above-detailed processes.

The semiconductor module and the manufacturing method therefor according to the second embodiment as described above have the following advantages:

(5) The warpage of the radiator 18 is suppressed because the projections 18a integrally formed with the radiator 18 reduce the internal stress of the radiator 18 in the extending direction of the radiator 18. This in turn leads to a reduction in the problems of separation of the radiator 18 from the semiconductor substrate 11 and warpage (deformation) of the semiconductor substrate 11 in the semiconductor module having the radiator 18 provided on the semiconductor substrate 11 when compared with the conventional semiconductor modules. Moreover, the projections 18a, which conduct heat from the semiconductor substrate 11 toward the radiator 18 to radiate out the heat, improve the heat radiation of the semiconductor module, when compared with a radiator without such projections which is connected to a semiconductor substrate through the insulating layer. Accordingly, this semiconductor module can suppress the reduction in reliability caused by the radiator 18 and improve the heat radiation.

(6) The projections 18a are arranged on the radiator 18 in a matrix array in plane to effectively reduce the internal stress of the radiator 18, thus further increasing the reliability of the semiconductor module.

(7) The projections 18a, which connect the radiator 18 and the semiconductor substrate 11, conduct heat from the semiconductor substrate 11 toward the radiator 18. Hence, the heat may cause the radiator 18 to extend. However, the projections 18a reduce an effect of the extension on the semiconductor substrate 11, i.e., a difference in extended amount between the radiator 8 and the semiconductor substrate 1, thus improving the reliability of the semiconductor module when compared with the conventional semiconductor modules.

(8) The copper plate 18z (being the radiator 18), which is integrally formed with the projections 18a, is manufactured in a separate process, thereby allowing only non-defective ones to be used. Moreover, the projections 18a, which are self-aligned and penetrate the insulating layer 17, are formed only by one process (press working). Accordingly, it is possible to improve the production yield of the radiator integrated with the projections when compared with the first embodiment. Therefore, it is possible to reduce the cost of a semiconductor module.

(9) The re-wiring pattern 14, which is integrated with the conductors 14a, is formed on the surface S2 (lower surface) of the semiconductor substrate 11, so that an effect of the stress of the radiator 18 on the semiconductor substrate 11, i.e., the stress of the radiator 18 reduced by the projections 18a, is balanced by an effect of the stress of the re-wiring pattern 14 on the semiconductor substrate 11, i.e., the stress of the re-wiring pattern 14 reduced by the conductors 14a. Accordingly, the balance of stress as well as the reduced internal stress of the radiator 18 by the projections 18a suppresses the warpage of the entire semiconductor module, thus further increasing the reliability of the semiconductor module.

(10) The copper plates 18z and 14z, which are the bases of the radiator 18 and the re-wiring pattern 14, respectively, are simultaneously subjected to press working, thereby reducing and suppressing the effect of the internal stress on the semiconductor module during the following manufacturing process. Accordingly, it is possible to improve the production yield of the semiconductor module, and thus to reduce the cost of the semiconductor module.

(11) Since the radiator 18, the re-wiring pattern 14, and the other elements are collectively formed in the semiconductor wafer before the semiconductor wafer is sectioned into individual semiconductor modules, the manufacturing cost of the semiconductor module can be reduced when compared with the case where the radiator 18, the re-wiring pattern 14, and the other elements are individually formed on each semiconductor module.

Third Embodiment

Figure 9:
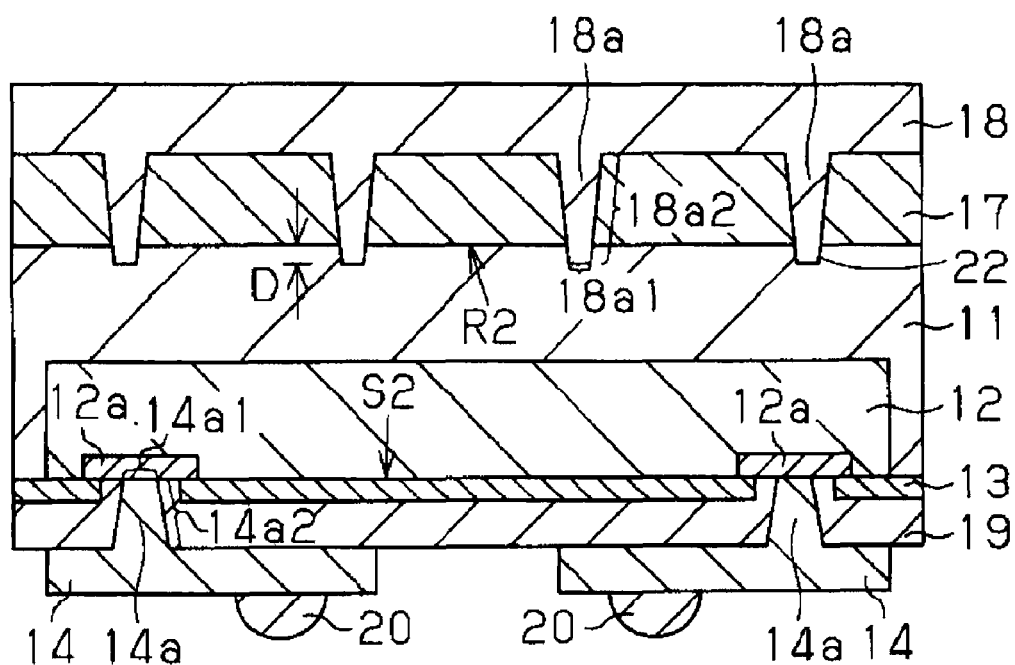
FIG. 9 is a schematic cross-sectional view of a semiconductor module according to a third embodiment of the present invention.

FIG. 9 is a schematic cross-sectional view of a semiconductor module according to a third embodiment of the present invention. The third embodiment differs from the second embodiment in that parts of the projections 18a are embedded in the rear surface R2 (upper surface) of the semiconductor substrate 11. The other configuration is the same as that of the second embodiment.

The configuration in which the projections 18a are embedded is achieved by forming recesses 22 in advance in regions to be connected with the projections 18a by photolithography and etching techniques, on the rear surface R2 (upper surface) of the semiconductor wafer (semiconductor substrate 11) prepared as shown in FIG. 7A. The recesses 22 are tapered suitable for portions in which the projections 18a are embedded. The recesses 22 each have a depth D of, for example, approximately 20 μm, and the projections 18a are formed higher accordingly.

The semiconductor module and the manufacturing method therefor according to the third embodiment have the advantages (5) to (11) described above and the following advantages:

(12) The top portions of the projections 18a are embedded in the semiconductor substrate 11, thereby increasing the contact areas between the semiconductor substrate 11 and the projections 18a and thus improving adhesiveness therebetween. Accordingly, it is possible to further increase the connection reliability between the semiconductor substrate 11 and the radiator 18 (projections 18a). The increased contact areas between the semiconductor substrate 11 and the projections 18a allow the heat from the semiconductor substrate 11 to be effectively conducted to the projections 18a, thus further increasing the heat radiation of the semiconductor module.

(13) The top portions of the projections 18a embedded in the semiconductor substrate 11 prevent relative displacement between the semiconductor substrate 11 and the radiator 18 even when a displacement stress is applied to between the semiconductor substrate 11 and the radiator 18, thus further increasing connection reliability between the semiconductor substrate 11 and the radiator 18.

(14) The recesses 22, which are formed in the rear surface R2 (upper surface) of the semiconductor substrate 11, allow self-alignment of the copper plate 18z, which is integrally formed with the projections 18a, in the press working, thereby easily manufacturing the semiconductor module.

Fourth Embodiment

Figure 10:
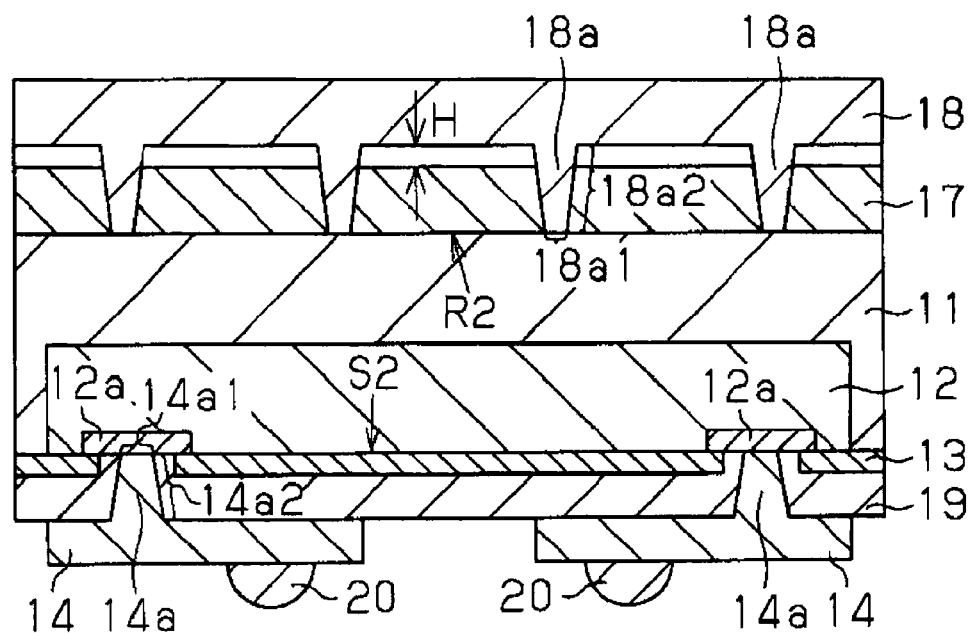
FIG. 10 is a schematic cross-sectional view of a semiconductor module according to a fourth embodiment of the present invention.

FIG. 10 is a schematic cross-sectional view of a semiconductor module according to a fourth embodiment of the present invention. The fourth embodiment differs from the second embodiment in that there is a gap H between the insulating layer 17 and the radiator 18. The other configuration is the same as that of the second embodiment. The gap H may be formed at least partially between the insulating layer 17 and the radiator 18 except the projections 18a. The gap H may open to the outside air in the direction crossing the semiconductor module. When the semiconductor module generates heat, this configuration allows the hot air in the gap H to be exchanged with the outside air, thereby improving the heat radiation of the semiconductor module. The gap H may be a closed space, so that it serves as a shock absorber with respect to a strain applied to the semiconductor module from outside to reduce damage to the semiconductor module.

Such a configuration is achieved by forming the insulating layer 17 thinner than the projections 18a during the press working of the copper plate 18z integrally formed with the projections 18a. The insulating layer 17 is, for example, approximately 75 μm thick, and the gap H between the insulating layer 17 and the radiator 18 is approximately 25 μm, accordingly.

The semiconductor module and the manufacturing method therefor according to the fourth embodiment have the advantages (5) to (11) described above and the following advantages:

(15) The gap H between the insulating layer 17 and the radiator 18 leads to an increase in contact areas between the radiator 18 and the outside environment (atmosphere), thus further increasing the heat radiation of the semiconductor module.

Fifth Embodiment

Figure 11:
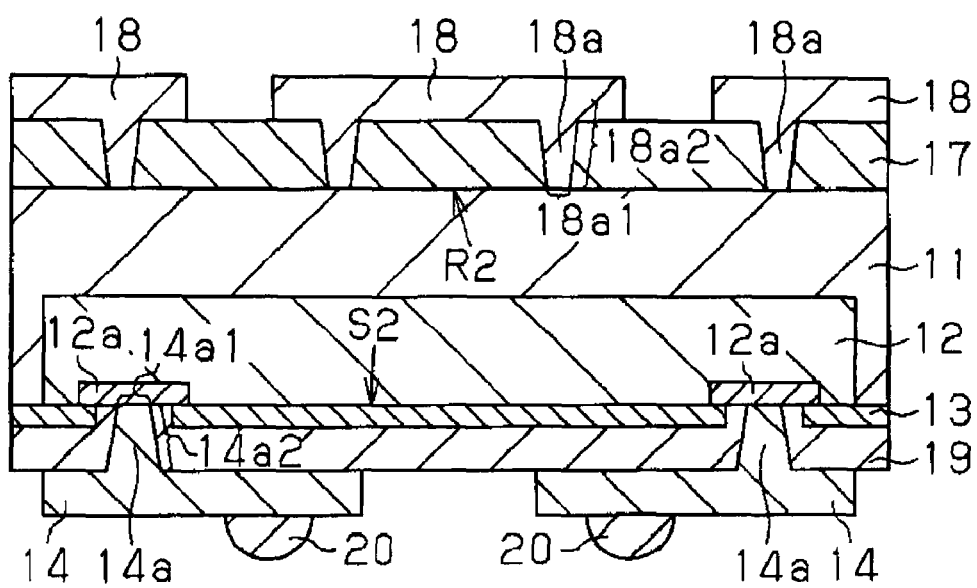
FIG. 11 is a schematic cross-sectional view of a semiconductor module according to a fifth embodiment of the present invention.

FIG. 11 is a schematic cross-sectional view of a semiconductor module according to a fifth embodiment of the present invention. The fifth embodiment differs from the second embodiment in that the thicknesses of the insulating layer 17 and the radiator 18 are the same as those of the insulating layer 19 and the re-wiring pattern 14, respectively, which are provided on the surface S2 (lower surface) of the semiconductor substrate 11, and then the radiator 18 is patterned. The other configuration is the same as that of the second embodiment. It should be note that the thicknesses of the insulating layer 17 and the radiator 18 are not required to be the same as those of the opposing elements if the elements on two sides of the semiconductor substrate 11 have the same thermal expansion coefficient.

Such a configuration is achieved by processing the radiator 18 into a predetermined pattern by photolithography and etching techniques before the radiator 18 and the semiconductor substrate 11 are compression-bonded, following the process shown in FIG. 7A. Alternatively, the radiator 18, which has been half-etched, may be compression-bonded to the semiconductor substrate 11 and then full-etched.

Alternatively, such a configuration is achieved by processing the radiator 18 into a predetermined pattern by photolithography and etching techniques, following the process shown in FIG. 7B.

The semiconductor module and the manufacturing method therefor according to the fifth embodiment have the advantages (5) to (11) described above and the following advantages:

(16) Parts of the radiator 18 which is processed into a predetermined pattern are usable as a wiring, for example, ground line, so that design freedom of wiring is improved and thus a small semiconductor module can be provided.

Sixth Embodiment

A portable device including any one of the semiconductor modules according to the above-described embodiments will now be described. A mobile phone is exemplified as the portable device, but examples of the portable device may include a personal digital assistant (PDA), a digital video camera (DVC), a music player, and a digital still camera (DSC).

Figure 12:
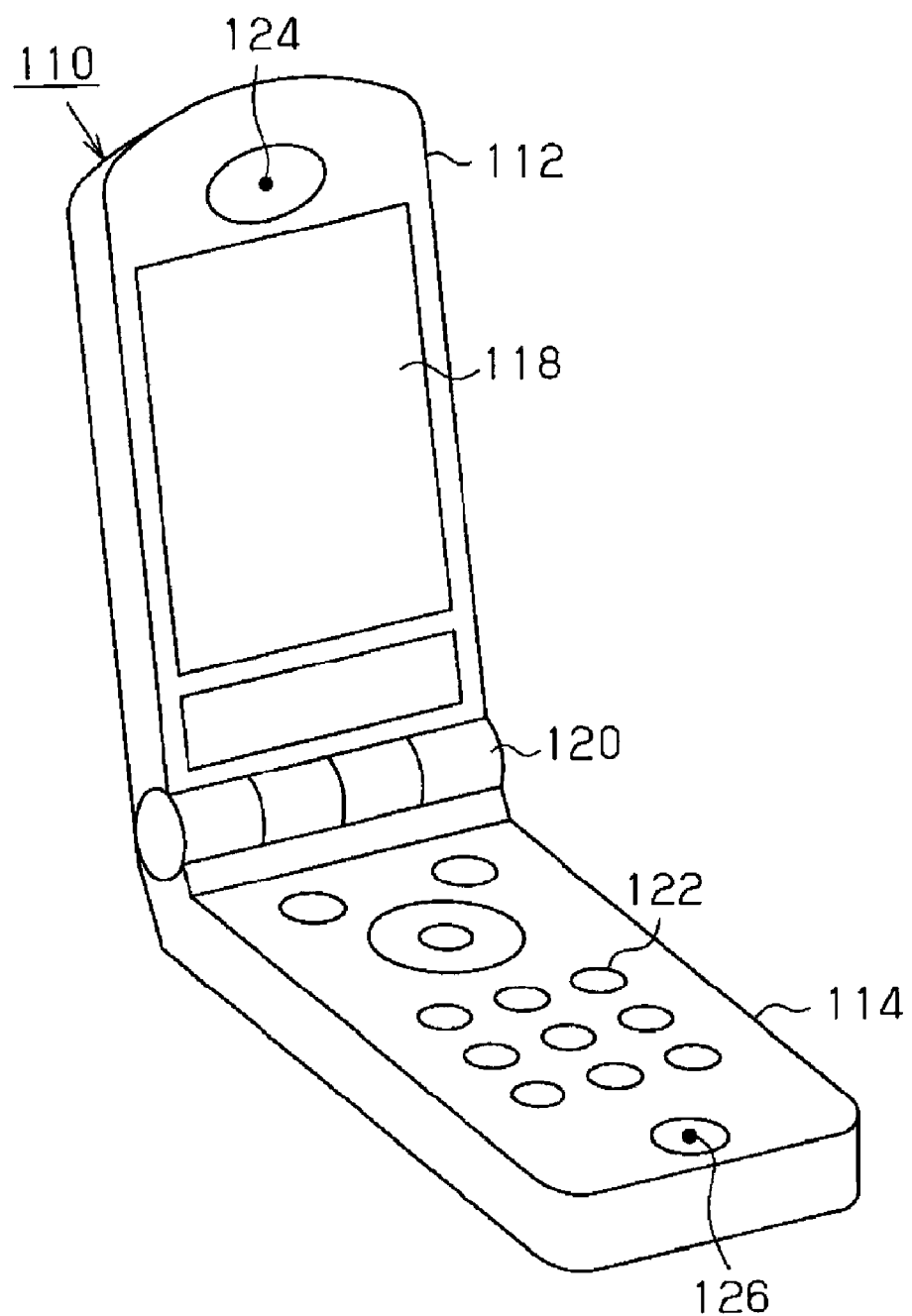
FIG. 12 is a schematic cross-sectional view of a mobile phone according to a sixth embodiment of the present invention.

FIG. 12 is a schematic cross-sectional view of a mobile phone according to a sixth embodiment of the present invention. A mobile phone 110 has a structure including a first casing 112 and a second casing 114 which are connected by a movable portion 120. The first casing 112 and the second casing 114 are rotatable about the movable portion 120 which serves as a rotating shaft. The first casing 112 is provided with a display 118, on which information such as characters and images are displayed, and a speaker 124. The second casing 114 is provided with a console portion 122, such as operation buttons, and a microphone 126. In the present embodiment, the semiconductor module according to the second embodiment (see FIG. 5) is installed in the mobile phone 110. Thus, the semiconductor module installed in the mobile phone is to be used as, for example, a power supply circuit for driving the other circuits, an radio-frequency (RF) generator, a digital-to-analog converter, an encoder, a driver for a backlight source of a liquid crystal panel used for the display of the mobile phone.

Figure 13:
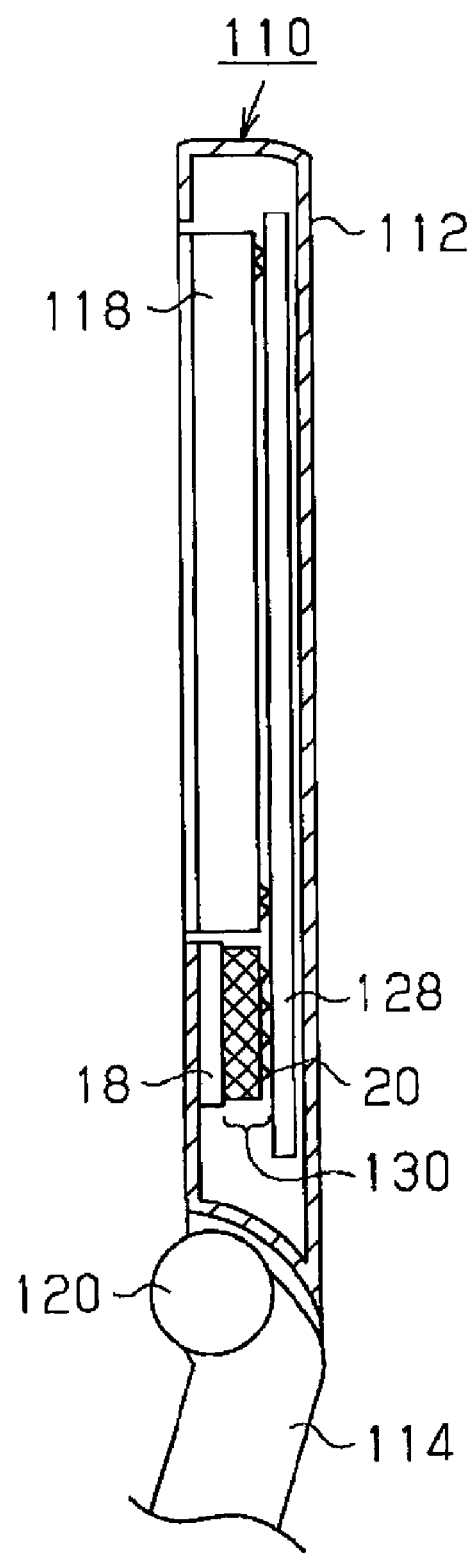
FIG. 13 is a partial cross-sectional view (a cross-sectional view of a first casing) of the mobile phone shown in FIG. 12.

FIG. 13 is a partial cross-sectional view (a cross-sectional view of the first casing 112) of the mobile phone as shown in FIG. 12. A semiconductor module 130 according to the sixth embodiment of the present invention is mounted on a printed circuit board 128 through the electrodes 20, and electrically connected to the display 118 and the like through the printed circuit board 128. The radiator 18 with the projections is formed on the rear surface of the semiconductor module 130 (the opposing surface to the electrodes 20). The radiator 18 comes into contact with the first casing 112 at one surface thereof. This configuration allows heat generated by the semiconductor module 130 to be effectively radiated out of the first casing 112 without filling the first casing 112 with the heat.

The portable device according to the sixth embodiment has the following advantages:

(17) The radiator 18 effectively radiates out heat of the semiconductor module 130, thereby preventing the temperature of the semiconductor module 130 from rising and thus reducing the thermal stress between the re-wiring pattern 14 and the insulating layer 19 and the thermal stress between the radiator 18 and the insulating layer 17. Accordingly, separation of the re-wiring pattern 14 in the semiconductor module from the insulating layer 19, and separation of the radiator 18 from the insulating layer 17 are prevented, thereby improving the reliability (heatproof reliability) of the semiconductor module 130. As a result, it is possible to improve the reliability (heatproof reliability) of the portable device.

(18) The semiconductor module 130, which is manufactured by the CSP (Chip Size Package) wafer process shown in the above embodiments, is thin and small, so that installing the semiconductor module 130 in a portable device allows the portable device to become thinner and smaller.

The first embodiment shows the radiator 8 covering the entire rear surface R of the semiconductor substrate 1, but the present invention is not limited thereto. Alternatively, for example, the radiator 8 may be patterned to selectively cover a specific region of the semiconductor substrate 1 as in the fifth embodiment. Even this modification has the same advantages as those of the first embodiment, on regions where the radiator 8 and the projections 8a located. The same modification is applicable to the second embodiment, thereby providing the same advantages thereto.

The first embodiment shows the semiconductor module being manufactured by dicing a semiconductor wafer together with the radiator 8 located in the scribe lines 5, but the present invention is not limited thereto. Alternatively, for example, the semiconductor module may be manufactured in such a way that the radiator 8 located in the scribe lines 5 is removed by etching before dicing and then the semiconductor wafer is divided into individual semiconductor modules by dicing. This modification reduces stress load caused by dicing of the radiator 8 (stress load transmitting from the radiator 8 to the projections 8a), thus reducing manufacturing variations of the semiconductor modules. Further to this, the manufacturing cost of the semiconductor module can be reduced. The same is true for the second to the fifth embodiments.

The first embodiment shows the projections 8a being arranged on the entire radiator 8 in a matrix array in plane, but the present invention is not limited thereto. Alternatively, for example, the projections 8a may be arranged on the radiator 8 at any positions in plane. In particular, if the projections 8a are selectively arranged on a region where the circuit element serving as a heater in the semiconductor substrate 1 is located, this modification allows effective heat radiation in the semiconductor module and thus improves the connection reliability. The same is true for the second to the fifth embodiments.

The first embodiment shows the projections 8a which are integrally formed with the radiator 8 and come into direct contact with the rear surface R of the semiconductor substrate 1, but the present invention is not limited thereto. Alternatively, for example, the insulating layer may be partly interposed between the rear surface R of the semiconductor substrate 1 and the projections 8a. This modification decreases the effect of improving the heat radiation of the semiconductor module, but it leads to a reduction in the problems of separation of the radiator 8 from the semiconductor substrate 1 and warpage (deformation) of the semiconductor substrate 1 because the projections 8a reduces the warpage of the radiator 8 when compared with the conventional semiconductor module.

The second embodiment shows the press working in which the copper plate 18z integrally formed with the projections 18a, and the copper plate 14z integrally formed with the projecting conductors 14a are simultaneously pressed against the semiconductor substrate 11. Alternatively, the copper plates may be subjected to two-step press working in such a way that one of the copper plates is subjected to a press working and the other copper plate is then subjected to another press working. Even this modification has the same advantages as those of the second embodiment. Alternatively, the copper plate 18z integrally formed with the projections 18a may be subjected to press working against the semiconductor wafer on which the re-wiring pattern 4 of the first embodiment, as shown in FIG. 3B, has been formed, thereby forming the radiator 18. This modification has at least the advantages of (5) to (8) described above.

The second embodiment shows the projections 18a which each have a round section and which tapers toward the top portion 18a1, but the present invention is not limited thereto. Alternatively, for example, each of the projections 18a may be a circular cylinder with a predetermined diameter. The projections 18a may each have a polygonal section such as square. Even these modifications allow effective heat radiation through the projections in the semiconductor module, so that the projections improve the connection reliability at those sites.

The third embodiment shows the projection 18a and the recess 22 which fits to the projection 18a, but the present invention is not limited thereto. Alternatively, for example, the projection 18a (especially, its top portion) may be larger than the recess 22 (opening size). The top portions of the projections 18a are crushed and thus change its shape by the pressure during press working. In this case, each projection 18a is embedded in each recess 22, and comes into contact with its surrounding semiconductor substrate 11. Accordingly, the contact areas between the projections 18a and the semiconductor substrate 11 are further increased, and thus the connection reliability and heat radiation is increased. Conversely, when the projection 18a (especially, its top portion) is smaller than the recess 22 (opening size), the projections 18a, even if crushed and thus changing its shape by the pressure during press working, are all placed within the recesses 22. As a result, it is possible to reduce variations in connection reliability and heat radiation caused by variations in contact areas of the projections 18a.

The third embodiment shows the recesses 22 corresponding to all projections 18a, respectively, but the present invention is not limited thereto. Alternatively, for example, some of the projections 18a may be not embedded in the recesses 22 for each of the semiconductor substrate 11 in the semiconductor wafer. This configuration is achieved in such a way that the recesses 22 are formed only on regions corresponding respectively to some of the projections 18a, and the heights of the projections 18a are adjusted accordingly. This modification has at least the advantages of (12) to (14) described above, at least on the regions where the projections 18a are embedded.

What is claimed is:

1. A semiconductor module comprising:
    a substrate consisting of semiconductive material with a first principal surface and a second principal surface opposing the first principal surface;
    a circuit element provided in at least a part of the substrate;
    an electrode provided on the first principal surface with the electrode being electrically connected to the circuit element;
    an insulating layer provided on the second principal surface;
    a radiator provided on the insulating layer; and
    a projection provided integrally with the radiator, with the projection penetrating the insulating layer to connect to the second principal surface, wherein the radiator includes patterned regions and the insulating layer is exposed through an entirety of an area between the patterned regions of the radiator.

2. The semiconductor module according to claim 1, wherein a plurality of the projections is arranged on the radiator in a matrix array in plane.

3. The semiconductor module according to claim 1, wherein a top of the projection is embedded in the substrate.

4. The semiconductor module according to claim 1, wherein a gap is formed between the insulating layer and the radiator, except for the projection.

5. The semiconductor module according to claim 1, wherein the radiator is patterned so as to selectively cover a specific region of the substrate.

6. The semiconductor module according to claim 1, wherein: the insulating layer is made of an insulating resin which is a material that undergoes plastic flow when placed under pressure; and
    the projection penetrates the insulating layer by compression-bonding the radiator onto the insulating layer to thermally connect the projection to the circuit element.

7. The semiconductor module according to claim 2, wherein: the insulating layer is made of an insulating resin which is a material that undergoes plastic flow when placed under pressure; and
    the projections penetrate the insulating layer by compression-bonding the radiator onto the insulating layer to thermally connect the projections to the circuit element.

8. The semiconductor module according to claim 3, wherein: the insulating layer is made of an insulating resin which is a material that undergoes plastic flow when placed under pressure; and
    the projection penetrates the insulating layer by compression-bonding the radiator onto the insulating layer to thermally connect the projection to the circuit element.

9. The semiconductor module according to claim 4, wherein: the insulating layer is made of an insulating resin which is a material that undergoes plastic flow when placed under pressure; and
    the projection penetrates the insulating layer by compression-bonding the radiator onto the insulating layer to thermally connect the projection to the circuit element.

10. The semiconductor module according to claim 5, wherein: the insulating layer is made of an insulating resin which is a material that undergoes plastic flow when placed under pressure; and
    the projection penetrates the insulating layer by compression-bonding the radiator onto the insulating layer to thermally connect the projection to the circuit element.

11. A portable device comprising:
    a casing; and
    the semiconductor module according to any one of claims 1 to 10, the semiconductor module being housed in the casing.

12. The portable device according to claim 11, wherein the radiator of the semiconductor module comes into contact with an inner surface of the casing.

* * * * *